United States Patent [19]
Hu et al.

[11] Patent Number: 5,320,875
[45] Date of Patent: Jun. 14, 1994

[54] METHOD OF PROVIDING AN ABRASION RESISTANT COATING

[75] Inventors: Ing-Feng Hu; James C. Tou, both of Midland, Mich.

[73] Assignee: The Dow Chemical Company, Midland, Mich.

[21] Appl. No.: 112,723

[22] Filed: Aug. 27, 1993

Related U.S. Application Data

[62] Division of Ser. No. 994,381, Dec. 21, 1992.

[51] Int. Cl.$^5$ .............................................. B05D 3/06
[52] U.S. Cl. ................................. 427/493; 427/255.3; 427/255.6; 427/255.7; 427/407.1; 427/489; 427/495; 427/539; 427/571; 427/578; 427/585; 427/598
[58] Field of Search ................ 427/489, 493, 495, 539, 427/571, 578, 585, 598, 255.3, 255.6, 255.7, 407.1

[56] References Cited

U.S. PATENT DOCUMENTS

| | | | |
|---|---|---|---|
| 4,137,365 | 1/1979 | Fletcher et al. | 428/412 |
| 4,260,647 | 4/1981 | Wang et al. | 427/579 |
| 4,493,855 | 1/1985 | Sachdev et al. | 427/489 |
| 4,755,426 | 7/1988 | Kokai et al. | 428/336 |
| 4,762,730 | 8/1988 | Enke et al. | 427/489 |
| 4,927,704 | 5/1990 | Reed et al. | 428/221 |
| 5,041,303 | 8/1991 | Wertheimer et al. | 427/575 |

FOREIGN PATENT DOCUMENTS 61-159426  7/1986  Japan.
63-179937  7/1988  Japan.

OTHER PUBLICATIONS

The Structure of Organosilicon Plasma-Polymerized Coatings on Metal Substrates I. H. Coopes and H. J. Griesser, Journal of Applied Polymer Science, vol. 37, 3413-3422 (1989).

*Primary Examiner*—Bernard Pianalto
*Attorney, Agent, or Firm*—Bruce M. Kanuch

[57] ABSTRACT

A method of preparing a coated substrate is disclosed. The substrate is coated with a plasma generated polymer containing Si, Or C and H in specific atom ratio wherein the polymer also contains certain functional groups, A power density of about $10^6$ to about $10^8$ J/Kg is employed in the plasma polymerization process.

5 Claims, 2 Drawing Sheets

METHOD OF PROVIDING AN ABRASION RESISTANT COATING

CROSS-REFERENCE TO RELATED APPLICATION

This is a divisional of application Ser. No. 07/994,381 filed Dec. 21, 1992.

BACKGROUND OF THE INVENTION

This invention relates to a method for producing transparent protective coatings on a substrate employing monomeric organosilicone compounds and oxygen using plasma enhanced chemical vapor deposition (PECVD) techniques.

Technology for improving the abrasion resistance of various surfaces, e.g., plastics, metals, etc. employing polymeric silicone compounds as a protective layer has been known for some time. Various PECVD processes have been developed but they all suffer from one or more defects. Some of the defects include cracking of the silicone compound coatings, delamination from the substrate surface and slightly colored coatings. Some of the coating techniques are also uneconomical, and some processes require that toxic materials be used. The resulting protective coatings are also sometimes not very abrasion resistant.

To overcome some of the defects, such as cracking, some PECVD organosilicone processes have been developed which require multiple steps thus driving up the cost of applying the coating (e.g., U.S. Pat. No. 4,927,704).

The present invention overcomes many of these problems to provide an adherent, very hard, non-cracking coating using a simple process scheme, requiring fewer steps. A thin plastic film substrate can be coated employing the principles of the invention, folded and creased without any substantial cracking of the coating.

SUMMARY OF THE INVENTION

A method of forming a protective abrasion resistant coating onto a substrate surface is provided. In this method a plasma enhanced chemical vapor deposition method (PECVD) is used to initiate the polymerization reaction of an organosilicone compound and excess oxygen employing a power density ranging from $10^6$ to $10^8$ Joules (J)/Kilogram (Kg), in the presence of a substrate having a suitable surface to cause the polymerization product of the plasma process to adhere to the substrate surface. Oxygen is present in an amount in excess of that stoichometrically necessary to oxidize all silicon and carbon in the organosilicone compound.

Power density is the value of W/FM wherein W is an input power applied for plasma generation expressed in J/sec, F is the flow rate of the reactant gases expressed in moles/sec and M is the molecular weight of the reactant in Kg/mole. For a mixture of gases the power density can be calculated from $W/\Sigma F_i M_i$ wherein "i" indicates the "i"th gaseous component in the mixture. It has been discovered that by practicing within the power density range and with excess oxygen a single polymerized protective layer can be formed on the substrate surface, the layer being substantially non-cracking, clear, colorless, hard and strongly adhered thereto.

The invention includes the embodiment of a substrate having a surface coated with a hard abrasion resistant polymer having the following composition $SiO_{1.8-2.4}$ $C_{0.3-1.0}$ and $H_{0.7-4.0}$ said numbers being atom ratios based on the electron probe analysis, Rutherford back scattering spectrometric analysis and elastic recoil spectrometric analysis. The polymer is further characterized, based on infrared spectrometric analysis, as being a highly crosslinked polymer containing at least one of the following:

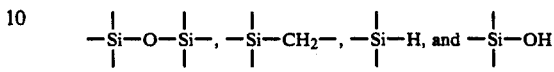

groups, and trapped water.

The abrasion resistant coating is generally referred to herein as $SiO_xC_yH_z$.

DETAILED DESCRIPTION OF THE INVENTION

The method for forming the plasma generated organosilicone polymeric coating of the present invention is carried out employing any known type of plasma polymerization equipment. Capacitive coupling modes or inductive coupling modes can be used to introduce the energy into the chemical system. Either one of these can include magnetic confinement.

Figure 1:
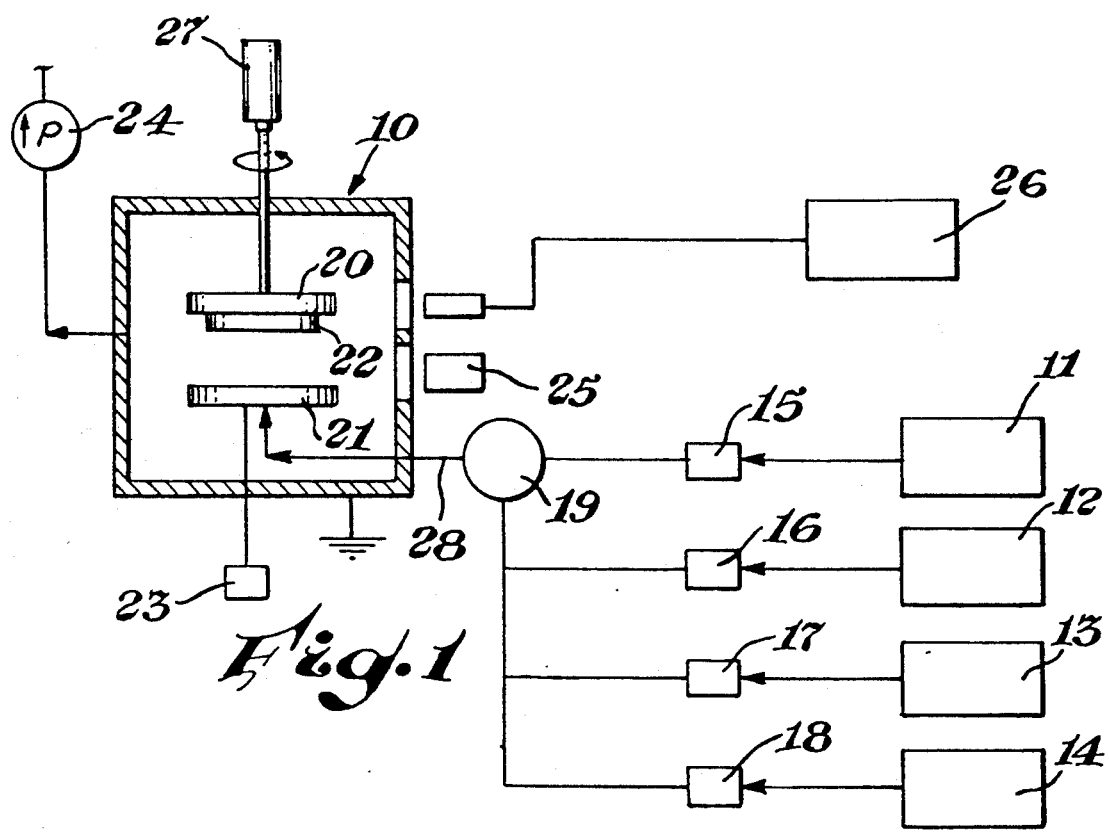
FIG. 1 is a schematic view of a plasma polymerizing apparatus which was used in the examples. Other types of plasma polymerizing apparatus can be used to practice the invention.

FIG. 1 illustrates an apparatus in which a plasma-polymerized film of the invention is formed on the surface of a substrate. This apparatus uses a variable frequency power source. The apparatus comprises a reactor vessel 10 into which the gaseous reactants are introduced from a organosilicone monomer source 11 and an oxygen source 12 and optionally inert gas sources 13 and 14 through mass flow controllers 15, 16, 17 and 18. If desired the different gases and vapors from the indicated sources can be mixed in a mixer 19 prior to introducing them into the reactor vessel.

Dispersed in the reactor vessel 10 are a pair of opposed electrodes 20 and 21. One electrode 20, the anode, is a rotary support electrode on which a substrate 22 to be treated is affixed. The substrate 22 to be treated is placed between the electrodes 20 and 21. Electrode 21, the cathode, is connected to a variable frequency power source 23 and the rotary support electrode 20 is grounded through the reactor vessel walls. Electrode 21 is of the shower head type through which the gaseous reactants are dispersed into the interior of the vessel from gas supply line 28. The electrode 21 is preferably of the magnetic confined type which is more fully shown in FIG. 2 and FIG. 3. Although the support electrode 20 is shown at the top and electrode 21 is shown at the bottom of the reactor vessel these can be reversed or positioned at different locations. Likewise, although the substrate 22 to be treated is shown attached to electrode 20 it could comprise a webb or bed and be moved along the electrode, if desired. The reactor vessel 10 is connected to a vacuum system 24 for evacuating the vessel. Optionally the reactor vessel could be equipped with monitoring devices such as an optical monitor 25 to determine the thickness of the coating and/or a spectrometer 26 to continuously monitor the reactive species formed in the plasma. The rotary support electrode is rotated by a motor 27, located, in this embodiment, outside of the vessel 10.

In operation the reactor vessel 10 is first evacuated by means of the vacuum pump 24 prior to introducing the gaseous reactants i.e., organosilicone and oxygen, and inert gases, if any, to the vessel at a predetermined flow rate through supply line 28. When the flow rate of the gases becomes constant the variable frequency power 23 is turned on to a predetermined value to generate a plasma which causes the reactants to polymerize and form a plasma-polymerized film on the substrate 22.

Figure 2:
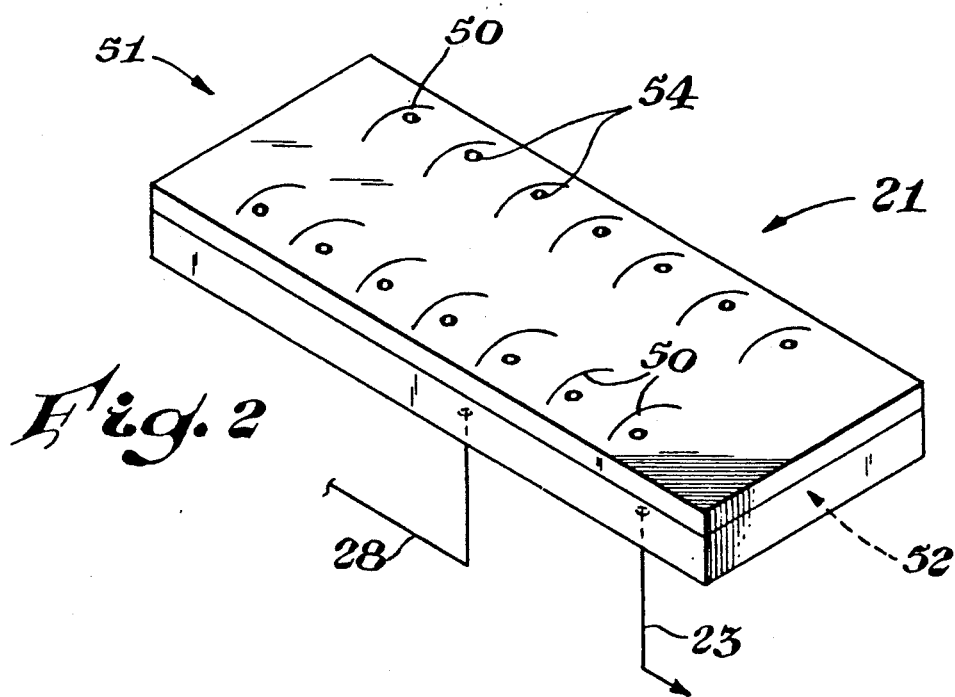
FIG. 2 is a schematic view of the cathode used in the apparatus shown in FIG. 1. Other cathode configurations can be used.
Figure 3:
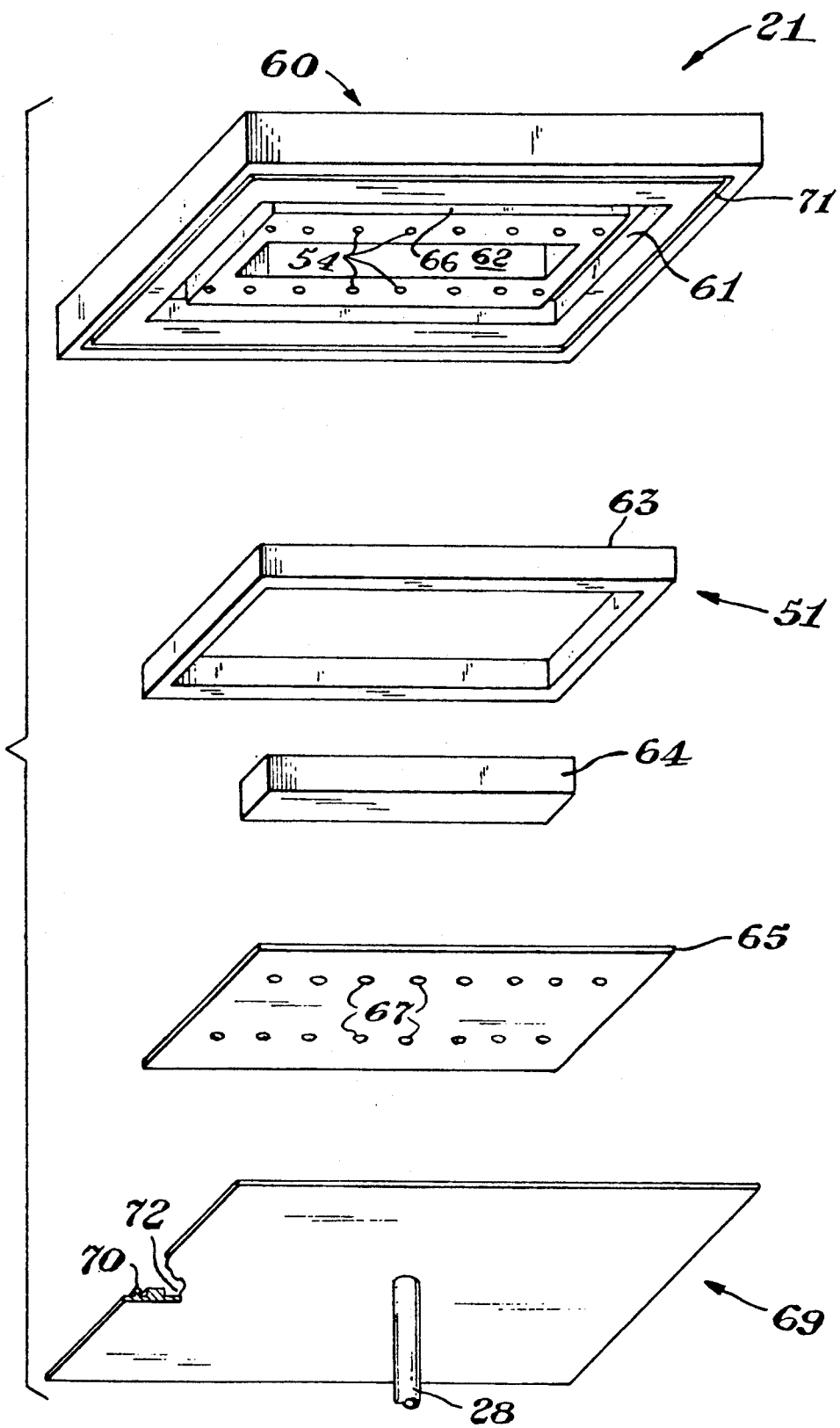
FIG. 3 is an exploded view of the cathode shown in FIG. 2. Other cathode configurations can be employed.

FIG. 2 illustrates in more detail the configuration of a magnetic confined electrode 21. The electrode 21 comprises a magnetron shower head configuration so that the gaseous reactants flow directly through a magnetic field 50 prior to forming the reactive plasma in the interior of the reactor 10. Thus, the magnetic field is contained in a zone which is directly adjacent to the zone where the plasma is formed. In FIG. 2, the cathode 21 comprises a body 51 having an internal magnetic means 52 (not shown in FIG. 2) for generating a magnetic field 50. The body contains an internal conduit means for transporting the gaseous reactants through the magnetic field 50. This flow is provided by a series of outlet ports 54 which mutually engaged the internal conduit means and the gas supply conduit 28. The embodiment of the cathode 21 of FIG. 2 is depicted in an exploded view in FIG. 3. The cathode 21 comprises the body 51 composed of a header 60 having channels 61 and 62 disposed therein which match a permanent north/south magnet 63 and a permanent south/north magnet 64. A plate 65 completely fills the outer boundary of channel 61 to hold the magnets 63 and 64 in the top channels 61 and 62. The plate 65 and the inner wall 66 in the top header have a series of ports 67 and 54 which align up when the cathode is assembled. A bottom plate 69 has a ridge 70 running about the top which matches a groove 71 in the header to provide a gas tight seal when the cathode is assembled. The bottom plate 69 is also provided with a inlet conduit 28 for introducing the gaseous reactants into the chamber 72 located between the bottom of the plate 65 and the top of the bottom plate 69 when the cathode is assembled. The electrode is assembled in a suitable manner such as by welding, use of fastening means, e.g. bolts, rivets and the like. In operation, gaseous reactants are introduced through inlet conduit 28 and into the chamber 72 and through aligned ports 67 and 54. The gaseous reactants then pass out of ports 54 and through the magnetic field 50 formed by the north and south components of the magnets 63 and 64. Flowing the gaseous reactants through the magnetic field causes them to be concentrated in the most intense portion of the plasma and thus provides for a more efficient process. This is an improvement over having the gases introduced into the chamber and through a magnetic field which surrounds the entire reaction chamber instead of through the electrode. The magnets should have sufficient strength to provide at least 100 gauss. It is preferred to provide the gas flow in a direction which is essentially perpendicular to the direction of the anode such as by use of a shower head cathode such as depicted in FIGS. 2 and 3.

Use of this configuration provides for a more uniform polymerized coating across the surface of the substrate than if the flow of gas is longitudinally across the surface of the substrate.

The following general procedures of using PECVD for polymerizing and laying down an abrasion resistant material can be used. When a discharge is produced at low pressure in the gaseous reactants, the reactants become ionized, forming a plasma. A portion of the material is in the form of reactive species such as ions, electrons, and free radicals generated in the plasma prior to formation of the film on the substrate. Most of the reactive species consist of the free radicals. It is thought that most of the film formation on the substrate occurs when the reactive species diffuse out of the plasma to the deposition surface. The reactive species react on a suitably prepared substrate surface to form the desired layer. A distinct advantage of PECVD over conventional chemical vapor deposition processes lies in the fact that the applied electric field enhances the formation of the reactive species thereby permitting the use of deposition temperatures which are low enough to prevent damage to substrates such as polycarbonates, i.e, temperatures less than about 130° C. Furthermore, when used under the process conditions disclosed herein, PECVD can be carried out with a much higher percentage of reactive species than is possible with conventional CVD.

In order to achieve the excellent results obtained by the present invention, use of the PECVD process should take place within the processing and compositional parameters disclosed herein.

In applying the abrasion resistant layer by PECVD, the substrate is placed in a reactor chamber in which an electric field can be generated. The reactor chamber must be capable of being substantially evacuated, i.e., to a pressure within the range of about $10^{-3}$ to about 1 Torr, preferably about $10^{-2}$ to about $10^{-1}$ Torr.

The method of generating and applying the electric field is not critical to this process. For example, the field may be generated by inductive coupling methods, as described, for example, by J. Vossen in *Glow Discharge Phenomena in Plasma Etching and Plasma Deposition*, J. Electrochemical Society, Feb. 1979, pp. 319-324.

A capacitively coupled system may also be used to generate an electric field, and is preferred for use in the present invention. By this technique, two electrodes are situated within the reaction chamber, and the plasma is formed there between. Each electrode may be a plate of a material that is a good electrical conductor, e.g., aluminum. The electrodes preferably each have a planar face parallel to the other electrode. A preferred embodiment of a cathode useful in the present invention is shown in FIG. 2 and FIG. 3.

In the preferred embodiment of the present process wherein the capacitively coupled system is utilized, the electrodes are horizontally arranged, i.e., an upper electrode is affixed in the upper region of the reactor chamber with a planar surface facing a planar surface of a lower electrode affixed in the lower region of the vacuum chamber. The spacing between the electrodes depends on the desired strength of the applied electric field, as well as the size, shape and chemical composition of the article being coated. Those skilled in the vapor deposition art appreciate the interrelationship of these processing variables and are therefore able to make adjustments for a particular use of this invention without undue experimentation. In a preferred embodiment, the substrate is positioned on the surface of the upper electrode which faces the lower electrode such that the substrate surface to be coated is parallel to the facing surface of the lower electrode. The lower electrode is preferably a shower head type providing a magnetic field through which the gaseous reactants must flow into the plasma.

The film-forming materials must be in gaseous form for the PECVD process. Gaseous reactants, such as organosilicone monomers, are vaporized from the liquid form prior to entry into the reactor chamber. A preferred technique when sufficient vapor pressures are difficult to obtain is to evaporate the nonvolatile reactant inside of the reaction chamber.

The liquid material may be degassed by cooling it and then subjecting it to a vacuum. Depending on its particular boiling point, the liquid is then heated to ambient temperature or higher in order to provide sufficient positive vapor pressure to flow through a channeling system to the reaction chamber. Alternatively, an inert carrier gas such as helium can be blown through the liquid to obtain a diluted vapor mixture of desired composition.

Gaseous reactants such as oxygen are suitable for reaction in the plasma, alone or with an inert carrier gas to insure proper metering into the reactor chamber.

The gaseous reactants may be supplied from an external source through a series of inlet pipes into the reactor chamber. The technical particularities of channeling the various gases into the reactor chamber are well known in the art and need not be described n detail here. For example, each gas conduit may be connected to a central feed line which carries the gases into the reactor chamber. In a preferred embodiment the gaseous reactants are mixed with a carrier gas such as argon to improve the flow of the reactants into the chamber. The flow of carrier and reactant gases into the reactor may be governed by mass flow controller valves which are well known in the art and which serve to both measure the flow of gases and to control such flow. Furthermore, the carrier gas, when used, may be premixed with the gaseous reactants or may be fed into the central feed line by a separate inlet. Although a carrier gas is not critical to the present invention, its use improves the uniformity of plasma density and gas pressure within the reactor chamber. Furthermore, use of the carrier gas tends to prevent gas phase particulation of the plasma-formed coating material, and also improves film quality in terms of transparency (when desired) and abrasion resistance.

When using the capacitively coupled method, the gaseous reactants entering the reactor chamber from the central feed valve are passed between the upper and lower electrodes and under the substrate to be coated. The quality of the coating on the substrate depends greatly on both the flow rate of the reactants and the flow dynamics. For example, excessive flow rates would force the gaseous reactants past the zone below the deposition surface before they react to form the coating on the surface. Conversely, if the flow rate is too small, the reactants will quickly be depleted and thereby lead to nonuniformities in film thickness. An improved method is described herein by using a shower head cathode which disperses the gaseous reactants in a line essentially perpendicular to the surface substrate, i.e., in a line which is perpendicular to the second electrode and not longitudinal thereto. The flow rate of reactants may range from about 5 sccm to about 250 sccm, with about 20 sccm to about 100 sccm being preferred. For coating surfaces larger than about 10 square feet, which might require larger reactor chambers, higher flow rates may be desirable, e.g., up to about 2000 sccm with appropriate pumping systems. As further described below, the interfacial material reactants may be passed into the reactor chamber with a carrier gas.

Preferably total gas flow into the reactor chamber should be constant during the deposition of the coating. This should not be viewed as an absolute requirement for good quality coatings, but as a more efficient means for process control.

The flow of the gaseous reactants relative to the deposition surface is important because it enhances the uniformity of the coating in terms of thickness and properties such as hardness, clarity, adhesion and thermal expansion compensation capabilities.

The substrate surface is usually cleaned by washing with an alcohol solvent such as isopropanol, methanol, etc. prior to application of the polymer layer. This step removes dirt, contaminants, and additives such as wetting agents from the surface.

After being washed, the substrate may be vacuum desiccated by well-known methods to remove any water on or in the surface region which would interfere with the adhesion of the subsequently-deposited layer. Desiccation temperatures range from about ambient temperature to about 120° C., with the preferred range being about 80° C. to about 90° C. Desiccation duration ranges from about 2 hours to about 16 hours, with longer times within this range compensating for lower temperatures, and vice versa.

If desired, the surface of the substrate can be etched after being placed in the reaction chamber. Etching techniques, which in general are well-known in the art, may also be used to create free radical species thereon which will later bond with the free radical species of the plasma-applied material, thereby improving adhesion between these layers. Surface activation techniques such as reactive or nonreactive plasma treatments, ion beam sputtering and the like can be employed.

As the gaseous reactants enter the reaction chamber after the coating surface is treated as described above, an electric field is generated under preselected frequency and power conditions to ionize the gas mix, thereby forming a plasma. Methods of generating an electric field between electrodes are well-known in the art and therefore do not require an exhaustive description here. An electric field, from D.C. to about 10 GHz may be used. For example, D.C. voltage, alternating current (A.C. frequency) and microwave frequency can be used.

A particularly suitable electrical field-generating means for this process is the use of a high frequency power supply to initiate and sustain the plasma. When such a power supply is used, a preferred operating frequency is 40KHz. The particular frequency and power values utilized will depend in part on the particular deposition requirement for the coating material. For example, when organosilicone monomers are reacting in the plasma, lower frequencies and higher electrical power values within the above-described ranges increase the deposition rate of the material, especially under the conditions of lower chamber pressures at a fixed flow rate.

As previously mentioned, however, all these parameters are adjusted to provide a power density within the described range during the PECVD coating of the substrate.

An additional refinement, well known in the art, which offers the potential for beneficially modifying the plasma (e.g., by increasing the ionization and providing improved spatial control of the plasma), uses separate magnetic fields in conjunction with the electric field. An example of such magnetic enhancement is "ECR" (electron cyclotron resonance) microwave plasma technique.

After passing over the surface to be coated, the carrier gas and any gaseous reactants or products which have not been deposited on the substrate surface may be directed out of the chamber through an exit valve and then to a gas pumping and exhaust system. Means for expelling these excess materials from the chamber are well known in the art. In FIG. 1 a general pumping system 24 is shown.

The present invention results in the formation of articles having a coating which is abrasion resistant. Furthermore, when the process is utilized to form a transparent material, the resulting film on the substrate is very smooth and free from microcracks. The deposited layer is capable of accommodating large differences in thermal expansion when the article is subjected to heating/cooling cycles. The coating is also resistant to certain chemicals and provides a decrease in permeability to certain fluids such as oxygen and water.

The substrate to be coated can be flexible or non-flexible (i.e., rigid) and can constitute an organic e.g., plastic, or metal or other inorganic material. The substrate may have any shape e.g., foam, film, rod, tube, irregular, etc. The plastic may be a thermoplastic or thermoset. Examples of thermoplastic materials which can be used are polyethylene, polypropylene, polystyrene, polyvinylacetate, polyvinylalcohol, polyvinylacetal, polymethacrylate ester, polyacrylic acids, polyether, polyester, polycarbonate, cellulous resin, polyacrylonitrile, polyamide, polyimide, polyvinylcbloride, fluorine containing resins and polysulfone. Examples of thermosets are epoxy and urea melamine.

As the organosilicone compound used in this invention are organic compounds in which at least one silicon atom is bonded to at least one carbon atom and includes for example silanes, siloxanes and silazanes. These organosilicone compounds may be used individually or in combinations of 2 or more. Examples of silanes include dimethoxydimethylsilane, methyltrimethoxysilane, tetramethoxysilane, ethyltrimethoxysilane, diethoxy-dimethylsilane, methyltriethoxysilane, octamethylcyclo-tetrasilane, triethoxyvinylsilane, tetraethoxysilane, dimethoxy-methylphenylsilane, phenyltrimethoxysilane, 3-glycidoxypropyltrimethoxysilane, 3-methacryloxypropyltrimthoxysilane, diethoxymethylphenylsilane, tris(2-methoxyethoxy)vinylsilane, phenyltriethoxysilane, and dimethoxydiphenylsilane.

Examples of siloxanes include tetramethyldisiloxane and hexamethyldisiloxane.

Examples of silazanes include hexamethyl-silazane and tetramethylsilazane.

It is critical to the practice of the invention that the PECVD process be carried out employing a power density ranging from about $10^6$ to $10^8$ J/Kg. Higher power densities produce films which easily crack while lower densities produce films which are less abrasion resistant. The power density comprises the sum of the individual power consumed by the gases involved in the reaction e.g., monomer and oxygen and, if used, an inert gas.

The substrate temperature is not critical and can range from ambient up to the glass transition temperature of the plastic of the substrate.

The flow rate of the polymerization gas is primarily dependent on the equipment employed to carry out the reaction and is directly related to the required power density. The maximum thickness of the coating will depend to some degree on the type of substrate employed. For example thicker coatings may be applied to hard substrates, e.g., silicon wafers. The preferred Thickness on plastic substrates is about 2 to about 8 microns depending on the use of the substrate.

The organosilicone coating may be post treated with an oxygen or organosilicone plasma to render the surface of the coating more hydrophilic or hydrophobic, respectively.

The method may be used to provide protective coatings on many different types of substrates. For example the coating may be employed to improve the abrasion resistance of optical lens e.g., eye glass lens etc., plumbing fixtures, vanes used in aircraft engines, optical memory discs, tapes and cards, glazing, camcorder and camera casings, airplane windows, solar panels, LCD windows, fibers and the like.

The following examples further illustrate various embodiments of the invention.

EXAMPLE 1

The deposition of $SiO_xC_yH_z$ was carried out in a PECVD stainless steel box equipped with a shower head planar magnetron cathode as shown in FIGS. 1, 2 and 3. Various substrates (in different examples) were placed 3.2 centimeters above the cathode and rotated around the center of the cathode. A mixture of 100 sccm $O_2$ and 5 sccm tetramethyldisiloxane (TMDSO) was fed into the chamber through the shower head cathode. The gas inlet holes of the shower head were evenly distributed on the plasma ring of the magnetron cathode. This configuration of gas inlet maximized the decomposition probability of tetramethyldisiloxane by allowing the molecules to flow through the most intense plasma region. The tetramethyldisiloxane vapor flow was controlled by a MKS Inc. vapor flow controller (Model 1152). The other gases were controlled by MKS gas flow controllers (Model 1160). The plasma power was supplied by an ENI power supply (Model PlasmaLoc 2). The power loaded to the plasma during deposition was 20-25 W at 40 KHz. This generated a power density of $6.7-8.4 \times 10^6$ J/Kg. The chamber base pressure before the coating was less than 1 mTorr. The process pressure was approximately 27 mTorr. The chamber was evacuated using an Edward Superpump system (Model E2M80/EH1200). Based on the film thickness measured by scanning electron microscopy, the deposition rate under these conditions was about 500 AÅ/min. Various substrates coated under the above conditions are described as follows.

a) An approximate $6\mu$ $SiO_xC_yH_z$ abrasion resistant layer was deposited on several polycarbonate samples (2.5 cm×2.5 cm×0.16 cm) on which a 10-20 AÅ Au-Pd layer was pre-deposited by magnetron sputtering of a Au (60%)-Pd (40%) target. The Au-Pd interlayer served as an indicator ensuring that the analytical volume remained in the abrasion resistant layer. Based on electron probe analysis (EPA), Rutherford back scattering spectrometric analysis (RBS) and elastic recoil spectrometric analysis (ERS), the film composition was determined to be $SiO_{2.2}C_{0.76-0.55}H_{2.1}$.

b) Approximate 2000 Å abrasion resistant layer as described in a) was coated on a KBr plate for purpose of infrared spectrometric analysis, indicating the presence of the following functional groups and trapped water:

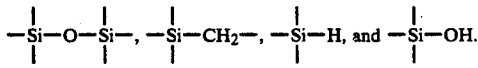

c) About $3\mu$ abrasion resistant layer as described in a) was coated on the quartz substrate. Employing a Shimazu Model 330 UV visible spectrometer, it was found that the coated quartz substrate exhibited 100% visible transmission.

d) The abrasion resistant layer as described in a) was coated on 10 cm×10 cm×0.2 cm polycarbonate sheets at these different thicknesses, approximately 2, 4 and $6\mu$. The abrasion resistances of the above three prepared samples were measured to exhibit 1-2% ΔHaze after 500 cycles at 500 g load Taber test (ASTM D1003-61 (1988)) using a Gardner Hazemeter Model UX10 with CS-10F wheel. It was found that the film withstood boiling water conditions for 2 hours without delamination. Additionally, it was found that the film retarded the oxidation of the plastic substrate as indicated by no decrease in the visible transmission of the film after being in contact with a cigarette lighter for 10 seconds. Furthermore, it was found that no observable attack was detected when the coated surface was rinsed with acetone or methylene chloride.

EXAMPLE 2

An approximate $6\mu$ $SiO_xO_yH_z$ coating was deposited on a polycarbonate substrate (2.5 cm×2.5 cm×0.16 cm sheet), which was pre-deposited with a 10-20 Å Au-Pd coating as described in Example 1. The flow rates were: 50 sccm $O_2$, 17 sccm Ar and 5 sccm TMDSO with a power of 20-25 W at 40 kHz. The power density in this example is equivalent to $9-12\times10^6$ J/Kg. The analysis by EPA, RBS and ERS gave the composition of the coating as $SiO_{2.2}C_{0.7-0.4}H_{1.7}$. The film coated directly onto the substrate surface without Au-Pd interlayer exhibited no visible scratches when the coated surface was rubbed with steel wool (#0) and is visibly transparent. The coating on the polycarbonate substrate withstood boiling water for 2 hours without delamination.

EXAMPLE 3

An approximate $3\mu$ abrasion resistant film was coated on an ABS substrate (10 cm×10 cm×0.2 cm, sheet) according to the conditions given in Example 2. The substrate surface was first pretreated with 15 seconds oxygen plasma at 20 sccm and 30 watts (Power density of $2.1\times10^2$ J/Kg) in the same equipment. The film was strongly adhered to the substrate as evidenced by the Scotch ® tape peeling test and had good abrasion resistance.

An approximate $3\mu$ abrasion resistant film generated as described in Example 2 was deposited on a polycarbonate substrate (10 cm×10 cm×0.2 cm sheet) which was pretreated with a plasma of 98 sccm Ar and 70 sccm He at a power of 50 W for 5 sec (power density of $1.6\times10^7$, J/Kg). The film exhibited an adhesion strength of 22 MPa based on the Sebastian (TM of Quad Group) stud test. The delamination was found to take place in the polycarbonate substrate and not at the interface of the coating and the substrate. The film adhesion strength did not change significantly after 30 minutes in boiling water.

Example 5

An approximate $4\mu$ abrasion resistant coating of $SiO_xC_yH_z$ was prepared on a polycarbonate eyeglass lens using the general processing conditions and apparatus taught in Example 1. The apparatus, however, had the electrodes in a reverse position, i.e., the cathode on top and anode on bottom. The following specific process conditions were used: Flow rates: $O_2=100$ sccm, TMDSO=5 sccm; power 20 watts; frequency 40KHz; distance between anode and cathode, 3.2 cm; time of reaction, 1 hour 15 minutes; power density $5.4\times10^6$ J/Kg. The coating showed no scratches when rubbed with steel wool (#0). The coated film also did not delaminate when submerged in hot water (55° C.) for 30 minutes.

EXAMPLE 6

An audio CD disc containing music encoded on the surface was coated with an approximate $3\mu$ $SiO_xC_yH_z$ polymer using the general process conditions set forth in Example 5 with the following specific parameters: Flow rates: $O_2=100$ sccm, TMDSO=10 sccm; power 20 watts; frequency 40 KHz; time 1 hour; power density $5.4\times10^6$ J/Kg. After coating, the CD disc was played on a CD player without any noticeable change in the quality of the music.

EXAMPLE 7

A hydrophobic abrasion resistant coating was deposited on a 15 cm×15 cm×0.16 cm UV stabilized polycarbonate sheet by the following steps:

Step 1. The surface was prewashed with methanol.

Step 2. The prewashed surface was treated with 10 sccm, 20 W, oxygen plasma at a power density of $1.4\times10^7$ J/Kg for 15 sec.

Step 3. An approximate $3\mu$ of the abrasion resistant coating $SiO_xC_yH_z$ was deposited on the prepared surface at 50 W, 40 KHz power and the flow rates of $O_2$, 50 sccm; Ar, 17 sccm and TMDSO, 20 sccm, (equivalent to a power density of $1.4\times10^7$ J/Kg).

Step 4. On the top of the abrasion resistant coating, an approximate 200 Å plasma polymerized TMDSO was deposited at 50 W, 40 KHz, power and TMDSO flow, 20 sccm, (equivalent to a power density of $2.5\times10^7$ J/Xg).

The resulting hydrophobic surface showed 83° contact angle and 70° receding contact angle with deionized water.

EXAMPLE 8

A hydrophilic abrasion resistant coating of $SiO_xC_yH_z$ was deposited on a 15 cm×15 cm×0.16 cm UV stabilized polycarbonate sheet by the following steps:

Step 1. The surface was prewashed with methanol.

Step 2. The prewashed surface was treated with 10 sccm, 20 W oxygen plasma at a power density of $1.4\times10^7$ J/Kg for 15 sec.

Step 3. An approximate $2\mu$ of the abrasion resistant coating $SiO_xC_yH_z$ was deposited on the prepared surface at 50 W, 40 KHz power and the flow rates of $O_2$, 50 sccm; Ar, 17 sccm and TMDSO, 20 sccm, (equivalent to a power density of $1.4\times107$ J/Kg).

Step 4. On the top of the abrasion resistant coating, a very thin layer (less than 100 Å) of SiOx was deposited at 50 W, 40 KHz, with 105 sccm $O_2$ and 1 sccm TMDSO, (equivalent to a power density of $1.5 \times 10^8$ J/Kg).

Step 5. The resulting surface was treated with 10 sccm $O_2$ plasma at 50 W (equivalent to a power density of $2.1 \times 10^9$ J/Kg) for 1 min.

The hydrophilic surface thus formed showed 43° contact angle and 0° receding contact angle with deionized water.

What is claimed is:

1. A method of providing an abrasion resistant coating onto the surface of a substrate employing plasma enhanced chemical vapor deposition of an organosilicone monomer gas in a plasma reaction zone and oxygen gas which comprises plasma polymerizing the organosilicone monomer in the presence of excess oxygen employing a power density within the range of about. $10^6$ to about $10^8$ J/Kg in the presence of the substrate.

2. The method of claim 1 including the step of conducting the oxygen and organosilicone monomer gases in a direction which is essentially perpendicular to the substrate surface and through a magnetic field of at least 100 gauss which is contained essentially in a zone adjacent to the plasma zone and into the plasma reaction zone.

3. The method of claim 1 wherein the organosilicone monomer and oxygen gases are flowed through a cathode in a direction which is essentially perpendicular to the surface of the substrate which is contained on an anode, said cathode also providing a magnetic field.

4. The method of claim 1 including the subsequent step of rendering the abrasion-resistant coating more hydrophobic by treating the abrasion resistant coating with a plasma polymerized second organosilicone coating.

5. The method of claim 1 including the subsequent step of treating the $SiO_x$ coating on the abrasion resistant layer with $O_2$ plasma to render the coating more hydrophilic.

* * * * *